United States Patent
Heame et al.

(10) Patent No.: US 8,704,689 B2
(45) Date of Patent: Apr. 22, 2014

(54) METHOD OF PROCESSING DATA SAMPLES AND CIRCUITS THEREFOR

(71) Applicant: Texas Instruments Incorporated, Dallas, TX (US)

(72) Inventors: Peter Heame, Buckinghamshire (GB); Richard Simpson, Bedford (GB)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/750,486

(22) Filed: Jan. 25, 2013

(65) Prior Publication Data

US 2013/0194112 A1 Aug. 1, 2013

(30) Foreign Application Priority Data

Jan. 27, 2012 (GB) .................................. 1201377.7

(51) Int. Cl.
*H03M 7/14* (2006.01)

(52) U.S. Cl.
USPC ............................................................ 341/96

(58) Field of Classification Search
USPC ............................................ 341/155, 96, 50
See application file for complete search history.

(56) References Cited

U.S. PATENT DOCUMENTS

| | | | |
|---|---|---|---|
| 6,226,664 B1 * | 5/2001 | Ng et al. ........................ | 708/683 |
| 7,352,297 B1 * | 4/2008 | Rylyakov et al. ............... | 341/50 |
| 7,409,415 B2 * | 8/2008 | Bosshart ........................ | 708/209 |
| 8,022,850 B2 * | 9/2011 | Newman ........................ | 341/144 |

* cited by examiner

*Primary Examiner* — Brian Young
(74) *Attorney, Agent, or Firm* — John R. Pessetto; Wade J. Brady, III; Frederick J. Telecky, Jr.

(57) ABSTRACT

The present invention relates to data manipulation and in particular incrementing, decrementing and comparing binary coded numbers, notably the manipulation of thermometer codes and the performance of arithmetic operations thereon. A method of processing data is provides which comprises receiving a series of data samples, each sample being represented as an N-bit thermometer code, wherein the most significant bit thereof represents the sign of the data sample value Y(n) and the remaining N−1 bits represent the magnitude of the data sample and executing a predetermined sequence of arithmetic operations directly on the series of N-bit thermometer code data samples to determine one of two values for each data sample, without any recoding of the thermometer code data samples.

15 Claims, 5 Drawing Sheets

METHOD OF PROCESSING DATA SAMPLES AND CIRCUITS THEREFOR

This application claims priority from GB Application no. 1201377.7, filed Jan. 27, 2012.

The present invention relates to data manipulation and in particular incrementing, decrementing and comparing binary coded numbers. The invention encompasses the manipulation of thermometer codes and the performance of arithmetic operations thereon and in particular the implementation of thermometer code arithmetic in a receiver used in high speed data transfer applications.

The ever increasing complexity and speed of digital hardware, together with constraints of chip real estate and space, have made the problems of interconnecting components increasingly difficult in applications having a need for high speed communication. In many intensive data transfer environments such as super computers and switch or router back planes, high speed serial transceivers, known as SerDes (serialiser/deserialiser) are commonly used to achieve high speed data transfer for chip-to-chip, board-to-board applications and even within a chip. SerDes run at speeds of several hundred Mega-bits per second (Mb/s) to Giga-bits per second (Gb/s). Typically, interconnections are implemented using analog based technology and, in order to avoid the use of a plurality of parallel connections between devices, a single differential analogue path is used running at a high data rate. One exemplary arrangement is specified by IEEE 802.3/AE/P.

Certain SerDes may incorporate a feed forward equaliser in addition to the more common decision feedback equaliser often used as a data slicer. The purpose of a feed forward equalizer is to remove the effect of the future data sample from a current data sample. Ordinarily a quantized feed forward equaliser (FFE) will apply a correction to the data sample when the future sample is above or below a threshold representing a slicing level of the FFE.

In a typical ADC-based SerDes configuration, the differential signal from a transmitter arrives at an Analogue-Digital converter (ADC) in a receiver and the signal amplitude is sampled once per symbol. The samples are processed to determine whether the differential signal is positive or negative, and to extract sufficient timing information in order to determine if the sample point is optimised. In an exemplary realisation of the ADC, the sample itself can have 14 different values which are all equally spaced representations of the signal amplitude, centred on zero but not containing zero (since there is no representation for the differential signal being zero). The ADC has thirteen levels (for 14 possible sample values) as follows: −6.5, −5.5, −4.5, −3.5, −2.5, −1.5, −0.5, +0.5, +1.5, +2.5, +3.5, +4.5, +5.5, and +6.5.

In accordance with the prior art, the ADC output values are represented in Table 1 below as two's complement 4 bit codes, with an implicit 0.5 bit offset The left hand bit for each value is the sign bit; a 1 represents a negative sample value, while a 0 represents a positive sample value. The remaining three bits are a standard binary weighted code representing the magnitude of the sample.

TABLE 1

| | Sample Value |
|---|---|
| 1110 | −6.5 |
| 1101 | −5.5 |
| 1100 | −4.5 |
| 1011 | −3.5 |
| 1010 | −2.5 |
| 1001 | −1.5 |
| 1000 | −0.5 |
| 0000 | +0.5 |
| 0001 | +1.5 |
| 0010 | +2.5 |
| 0011 | +3.5 |
| 0100 | +4.5 |
| 0101 | +5.5 |
| 0110 | +6.5 |

In the above sign magnitude binary (i.e., 4-bit code) implementation, processing a series of samples (Y(0), Y(1), Y(2) . . . Y(n), Y(n+1), . . . ) from the ADC typically involves a limited set of arithmetic operations, namely, increment, decrement and magnitude compare. As illustrated in the flow diagram of FIG. 1, the FFE operation on a sample Y(n) involves comparing the magnitude of the next consecutive sample Y(n+1) to a first threshold th1, conditionally incrementing or decrementing Y(n) to produce an adjusted value (Y_adjust(n)) bearing the feedforward correction and comparing the adjusted value to a second threshold value (th2) to determine whether symbol(n) is +1 or −1. Because Y(n+1) can have a positive or negative value, the first magnitude compare step potentially involves two comparison steps; a first comparison (100) to a positive threshold (+th1) followed by a second comparison (101) to a negative threshold value (−th1) if the magnitude of sample value Y(n+1) is less than the positive threshold value (+th).

The selected y(n) value is then forwarded to the data slicer for comparison (102) with a second threshold, being for example the present slicing level of a DFE. This will decide the final symbol value here defined as +1 or −1.

An example of a circuit realization of the above implementation is shown in FIG. 2. The circuit comprises a sign magnitude to 1's complement stage (20) (In order to simplify the computation), an incrementer stage (22), a decrementer stage (24) a magnitude compare stage (26) and multiplexing stage (28) and a re-conversion to sign magnitude format stage (30). As can be seen, this realization is complex involving many components with considerable logic path depth which in turn adversely affects the speed of the circuit. For example, the circuit realisation a magnitude compare operation has a maximum logic path of five, while each of the magnitude increment and decrement operations has a logic depth of two.

Many ADCs output values as a multi-bit thermometer code rather than binary code. The main advantage of the thermometer code is that it is monotone, i.e., between individual codes, there exists only a transition of one bit from one code state (e.g., zero) to the other code state (e.g., one). For example, given a three-bit binary code transition from 011 (decimal 3) to 100 (decimal 4) wherein the MSB bit transitions from zero to one and the other bits transition from one to zero, the corresponding thermometer code transition will be 00000111 to 00001111. Since only one bit transitions from a zero to a one in the thermometer code, less errors typically would occur in any output signal that the thermometer code may represent thus yielding an advantage in the thermometer code as compared with the binary code. However, in comparison to binary code, a thermometer code does not represent numbers efficiently in terms of the number of bits required. For instance, an 8-bit thermometer code can represent any one of 9 different numbers (including 0) while a typical 8-bit binary code can represent 256 different numbers. Therefore, the thermometer code output of an A/D converter is usually converted by an encoding circuit to a more compact and useful binary code before further processing of sample values or before being transmitted as data to external circuits. However it has been found that the logic required to recode the magnitude portion of the thermometer code output can introduce significant delay into the signal processing due to the use of multiple registers to store output values prior to conversion. In high speed SerDes applications, any such further delays in signal processing are undesirable.

As data rate requirements increase still further, there is a need to provide improved techniques for processing sample values that can be implemented with simple logic with minimal delay.

Examples of the invention will now be described with reference to the accompanying drawings, of which:

Figure 1:
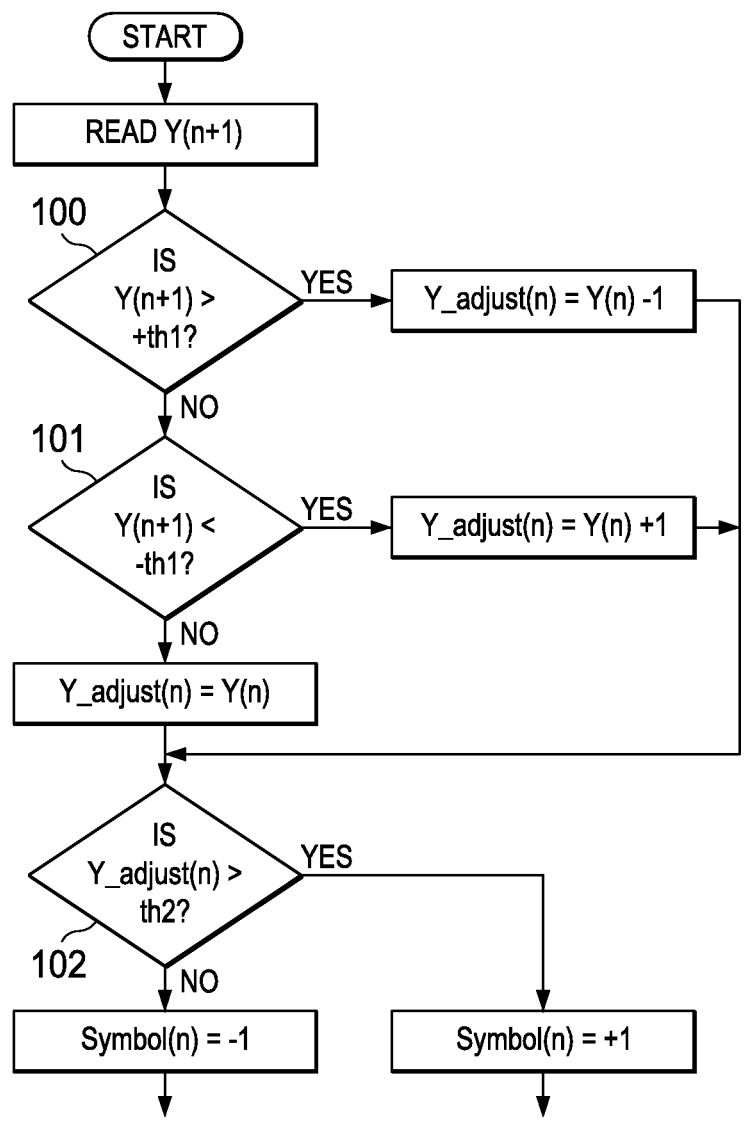
FIG. 1 is a flow diagram of a conventional algorithm comprising a set of operations performed on a sample value output from an analog to digital converter (ADC)

The present invention provides apparatus and method as set forth in the claims.

In particular, the present invention, in one aspect thereof, provides a method of processing data comprising receiving a series of data samples (Y(1) Y(2) . . . Y(n), Y(n+1)), each sample being represented as an N-bit thermometer code, wherein the most significant bit thereof represents the sign of the data sample value Y(n) and the remaining N−1 bits represent the magnitude of the data sample; and executing a predetermined sequence of arithmetic operations directly on the series of N-bit thermometer code data samples to determine one of two values for each data sample, without any recoding of the thermometer code data samples.

In some applications, the step of executing a predetermined sequence of arithmetic operations comprises for each data sample Y(n), comparing the magnitude of the next consecutive data sample Y(n+1) in the series of data samples to a first threshold (th1); if the magnitude of Y(n+1) is less than the first threshold (th1), setting an adjusted value (Y_adjust (n)) of data sample Y(n) to the value of data sample Y(n); if the magnitude of data sample Y (n+1) is not less than the threshold (th1), determining the sign of the data sample Y(n+1) from the MSB of Y(n+1); incrementing or decrementing the value of Y(n) in dependence on the sign of the data sample Y(n+1); comparing the magnitude of the adjusted value of Y(n) (Y_adjust (n)) to a second threshold value (th2); determining one of two values for data sample Y(n) on the basis of the comparison with the second threshold value (th2). The threshold may be specified as a binary code.

In some applications where a comparing step comprises providing a plurality of two input multiplexers arranged in cascaded stages, there being one stage for each bit of said binary code and each multiplexer in a stage receiving a respective bit at its select input in order of bit significance; each multiplexer of a first stage receiving a pair of thermometer code bits of consecutive significance, excepting the multiplexer which receives the bit of least significance which also receives a permanently high bit value and likewise excepting the multiplexer which receives the bit of greatest significance which also receives a permanently low bit value, each multiplexer of said stage providing its selected output; and each multiplexer of a next stage receiving a pair of outputs from a previous stage; wherein the outputs of said first stage of multiplexers are selected by the binary code bit of least significance and wherein the outputs of said next stage of multiplexers are selected by the binary code bit of next significance, the output of a final stage of said multiplexers being by the binary code bit of greatest significance to produce an output representative of said comparison.

In some applications where the step of incrementing or decrementing the value of Y(n) in dependence on the sign of the data sample Y(n+1) comprises; decrementing the value of Y(n) to provide an adjusted value (Y_adjust (n)) of data sample Y(n) if the MSB of Y(n+1) has a positive value; or incrementing the value of Y(n) to provide an adjusted value (Y_adjust (n)) of data sample Y(n), if the MSB of Y(n+1) has a negative value.

Moreover, a step of incrementing or decrementing may comprise providing a plurality of multiplexers receiving bits of said thermometer code, each multiplexer receiving a first bit of a certain significance at a first input; a second bit of two greater significance than said certain significance at a second input; and providing a select input to each multiplexer to provide an increment if said first input of each multiplexer is selected by said select input and a decrement if said second input of each multiplexer is selected by said select input. Furthermore, a multiplexer may receive a permanently high value at its first input and a thermometer code bit of next to least significance at its second input. Yet further, a multiplexer may receive a permanently low value at its second input and a thermometer code bit of next to greatest significance at its second input.

In some applications the step of determining one of two values for data sample Y(n) on the basis of the comparison with the second threshold value (th2) may comprise determining that data sample Y(n) has a value of +1, if the magnitude of the adjusted value of Y(n) (Y_adjust (n)) is greater than the second threshold (th2); or determining that data sample Y(n) has a value of −1, if the magnitude of the adjusted value of Y(n) (Y_adjust (n)) is not greater than the second threshold (th2). The N-bit thermometer code may be a 7-bit code.

The present invention in another aspect thereof provides a magnitude comparator for comparing a value represented by a thermometer code with a value represented by a binary code including a plurality of two input multiplexers arranged in cascaded stages, there being one stage for each bit of said binary code and each multiplexer in a stage receiving a respective bit at its select input in order of bit significance; each multiplexer of a first stage receiving a pair of thermometer code bits of consecutive significance, excepting the multiplexer which receives the bit of least significance which also receives a permanently high bit value and likewise excepting the multiplexer which receives the bit of greatest significance which also receives a permanently low bit value, each multiplexer of said stage providing its selected output; and each multiplexer of a next stage receiving a pair of outputs from a previous stage; wherein the outputs of said first stage of multiplexers are selected by the binary code bit of least significance and wherein the outputs of said next stage of multiplexers are selected by the binary code bit of next significance, the output of a final stage of said multiplexers being by the binary code bit of greatest significance to produce an output representative of said comparison.

Moreover in a further aspect of the present invention a method for comparing a value represented by a thermometer code with a value represented by a binary code includes the steps of providing a plurality of two input multiplexers arranged in cascaded stages, there being one stage for each bit of said binary code and each multiplexer in a stage receiving a respective bit at its select input in order of bit significance; each multiplexer of a first stage receiving a pair of thermometer code bits of consecutive significance, excepting the multiplexer which receives the bit of least significance which also receives a permanently high bit value and likewise excepting the multiplexer which receives the bit of greatest significance which also receives a permanently low bit value, each multiplexer of said stage providing its selected output; and each multiplexer of a next stage receiving a pair of outputs from a previous stage; wherein the outputs of said first stage of multiplexers are selected by the binary code bit of least significance and wherein the outputs of said next stage of multiplexers are selected by the binary code bit of next significance, the output of a final stage of said multiplexers being by the binary code bit of greatest significance to produce an output representative of said comparison.

In a yet further aspect thereof, the present invention provides an incrementer/decrementer for a thermometer code including a plurality of multiplexers receiving bits of said thermometer code, each multiplexer of said incrementer/decrementer receiving a first bit of a certain significance at a first input; a second bit of two greater significance than said certain significance at a second input; and a select input, the incrementer/decrementer providing an increment if said first input of each multiplexer is selected by said select input and a decrement if said second input of each multiplexer is selected by said select input. Advantageously, the incrementer/decrementer includes a multiplexer receiving a permanently high value at its first input and a thermometer code bit of next to least significance at its second input. To advantage the incrementer/decrementer includes a multiplexer receiving a permanently low value at its second input and a thermometer code bit of next to greatest significance at its second input.

The present invention in yet another aspect thereof provides a method of incrementing/decrementing a thermometer code includes providing a plurality of multiplexers receiving bits of said thermometer code, each multiplexer receiving a first bit of a certain significance at a first input; a second bit of two greater significance than said certain significance at a second input; and providing a select input to each multiplexer to provide an increment if said first input of each multiplexer is selected by said select input and a decrement if said second input of each multiplexer is selected by said select input. A multiplexer receives a permanently high value at its first input and a thermometer code bit of next to least significance at its second input and to advantage a multiplexer receives a permanently low value at its second input and a thermometer code bit of next to greatest significance at its second input.

In the algorithm underlying the present invention, the ADC output values are represented as a 7-bit thermometer code, rather than the sign magnitude 4 bit code described above. As explained above, thermometer code output of an ADC is generally converted to a more compact code before any processing of the data occurs. The present invention eliminates any requirement for conversion from thermometer code, instead performing arithmetic functions directly between sign thermometer code data and sign binary code data. Hence, the logic required to recode the output values and the consequential delays are eliminated. Furthermore, the logic required to implement the thermometer code arithmetic operations is very simple and involves substantially shorter logic paths than that used to implement the binary sign magnitude operations described above.

As in the prior art described above, the ADC has thirteen levels (for 14 possible sample values) centred around, but not including, zero. The ADC output sample values are represented as a 7-bit thermometer code as set out in Table 2 below. Again the MSB represents the sign of the sample value, "1" for a negative value and "0" for a positive value, while the remaining 6 bits are a thermometer coded representation of the magnitude of the sample value.

TABLE 2

| ADC Output | Sample Value |
| --- | --- |
| 1111111 | −6.5 |
| 1011111 | −5.5 |
| 1001111 | −4.5 |
| 1000111 | −3.5 |
| 1000011 | −2.5 |
| 1000001 | −1.5 |
| 1000000 | −0.5 |
| 0000000 | +0.5 |
| 0000001 | +1.5 |
| 0000011 | +2.5 |
| 0000111 | +3.5 |
| 0001111 | +4.5 |
| 0011111 | +5.5 |
| 0111111 | +6.5 |

However as stated above, the algorithm of present invention advantageously performs arithmetic operations directly on the thermometer code output of the ADC rather than recoding to binary data. The flow diagram of FIG. 1 would be equally applicable to the present invention since the underlying algorithm is not changed, however as will be appreciated the implementation thereof has been simplified and made more efficient by direct processing of the thermometer code without any recoding.

The operation of the exemplary embodiment will now be described in the context of operation on a sample value Y(n). As in the prior art, the operation on Y(n) involves comparing the magnitude of the next consecutive sample Y(n+1) to a first threshold th1. If the magnitude of Y(n+1) is less than the threshold (th1), the adjusted value Y_adjust (n) is taken as the sample value Y(n) and the process proceeds to the second magnitude compare step. If the magnitude of Y(n+1) is not less than the threshold (th1), the sign bit of Y(n+1) is examined to determine whether on not Y(n+1) has a positive value (i.e. the MSB is 0). If Y(n+1) is determined to be positive, the value of Y(n) is decremented to produce the adjusted value Y_adjust (n) and the process proceeds to the second magnitude compare step. If Y(n+1) is not positive (i.e., MSB is 1), then the value of Y(n) is incremented to produce the adjusted value Y_adjust (n) and the process proceeds to the second magnitude compare step.

The second magnitude compare (data slicing) is equivalent to that shown in the flow chart of FIG. 1, with the magnitude of the adjusted value Y_adjust (n) being compared to a second threshold in order to determine whether the symbol (n) is +1 or −1. In this instance, the use of the sign magnitude numbers to determine whether the sample is positive or negative simplifies the first magnitude compare step in that a single comparison step only is ever required. If the sample is above the positive threshold (i.e., the magnitude of Y(n+1) is not less than th1 and Y(n+1) is positive), a first action is taken (i.e., Y(n) is decremented). If the sample is below the negative threshold (i.e., the magnitude of Y(n+1) is not less than th1 and Y(n+1) is not positive), a second action is taken (i.e., Y(n) is incremented. If the sample is neither above the positive threshold or below the negative threshold (i.e., the magnitude of Y(n+1) is less than th1), a third action is taken (i.e., no increment or decrement is made and Y(n) is taken as the adjusted value Y_adjust(n)).

Figure 3:
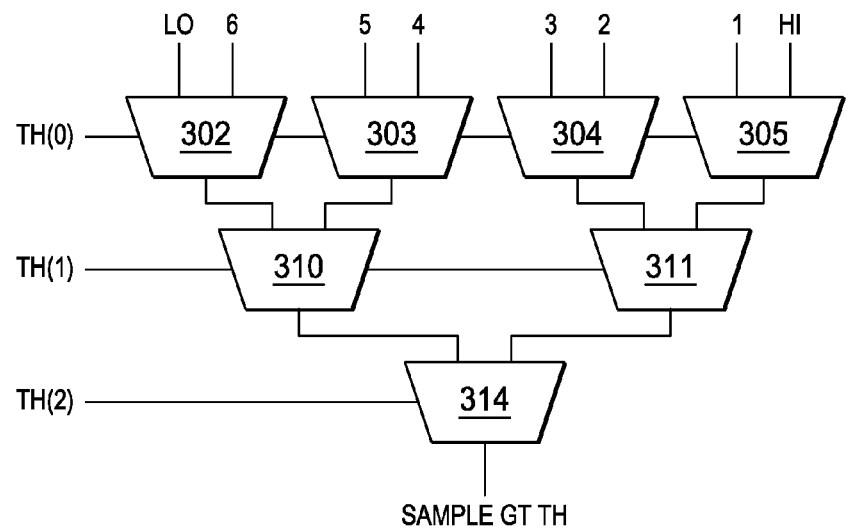
FIG. 3 is a block diagram of a circuit realisation of a magnitude compare operation in accordance with the present invention.

An example of a circuit realization of the magnitude compare operation used in the above algorithm and in accordance with the present invention is shown in FIG. 3 comprising a series of 2:1 multiplexers as the functional elements. The threshold values th1 and th2 are 3-bit binary codes and the operand is the 7-bit thermometer code output from the ADC. As shown in FIG. 3, the 6 LSB bits of the thermometer code (i.e., the bits representing the magnitude of the sample) are input to a first series of four 2:1 MUXs 302-305, while the first (LSB) bit of the binary code threshold (TH0) serves as the control input. The second bit of the threshold code (TH1) is the control input to a second series of two Muxes 310 and 311, the inputs of which are the respective outputs of the first series of MUXS 302-305 while the third (MSB) of the binary threshold code (TH3) is the control input to MUX 314 which receives the respective outputs of the second series of MUXes 310 and 311 at its input.

The circuit operates as follows. If the threshold (th) has a value 000 (i.e., decimal 0), then HI input of MUX 305 is selected as all sample magnitudes are greater than zero. If the threshold code (th) is 010 (i.e., decimal 2), then bit 2 of the 7-bit thermometer code is set by setting the first input of MUX 304. As can be seen from Table 2, this bit is set for all samples having a magnitude of 2.5 or more. Similarly, if the threshold code (th) is 011 (i.e., decimal 3), then bit 3 of the 7-bit thermometer code is set by setting the second input of MUX 304. Again, as can be seen from Table 2, this bit is set for all samples having a magnitude of 3.5 or more. Finally, if the threshold code (th) is 111 (decimal 7), then the LO input of MUX 402 is set as no sample will have a value greater than 7. In this way, only those bits of the 7-bit thermometer code sample that require examination in order to determine the magnitude compare are selected depending on the value of the threshold. In other embodiments, particularly if the code length were longer, it may be advantageous to group the bits and perform a corresponding selection of a group. That group could then be subject to further bit or group selection in a cascaded structure.

Figure 2:
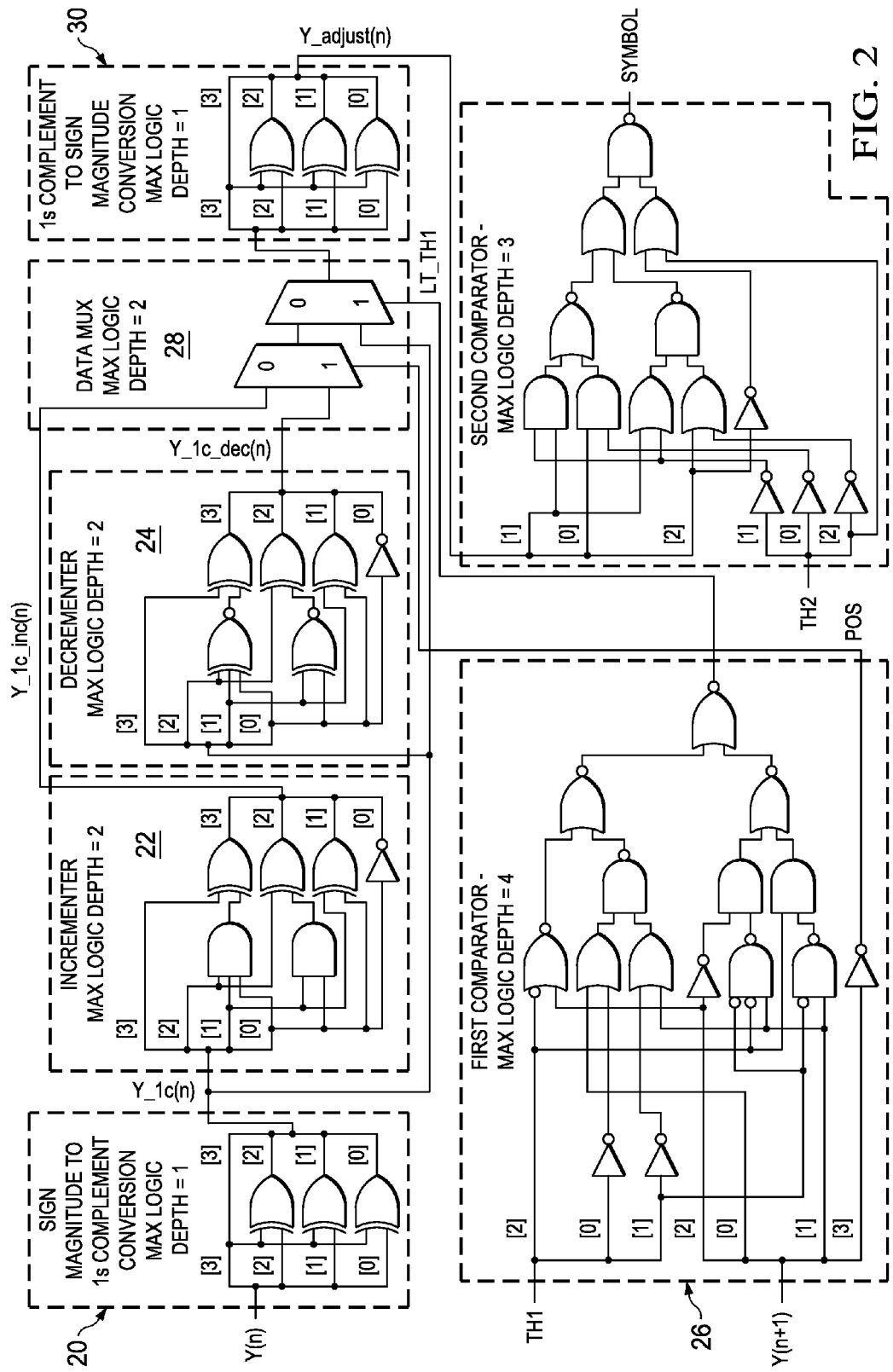
FIG. 2 is a diagram of a circuit realisation of the algorithm illustrated in the flow diagram of FIG. 1.

Since the magnitude compare function is configured entirely using basic 2:1 MUXs, the circuit is very cost effective to realise. In addition, since a 2:1 MUX can be regarded having a single gate delay, the delay through the magnitude compare circuit is just three gates which compares very favourably with the corresponding circuit of FIG. 2 which has a maximum logic depth of five.

The other types of operation used in the algorithm underlying the present invention are magnitude increment and decrement. These functions can also be accomplished directly on the thermometer code output of the ADC and realised with simple circuit elements. A magnitude increment corresponds to shifting the code to the left, with a '1' being shifted in from the right. A decrement corresponds to shifting the code to the right, with a '0' being shifted in from the left.

An example of a circuit that can produce a magnitude increment or decrement directly on the thermometer code output of the ADC is shown in FIG. 4, again comprising a series of six 2:1 multiplexers 402-412 as the functional elements. There is only one instance of this circuit required in the SerDes, since it functions either to increment or to decrement and which is performed may be determined by the sign bit of the thermometer code; the result of the threshold comparison may control a further MUX to select between the incremented/decremented value of Y(n) and the unmodified value.

If the thermometer code is 0000000, selecting the HI input of MUX 412 will produce a magnitude increment at its output, a magnitude decrement from this value not being possible. For thermometer code 1000000, selecting the HI input of MUX 412 will produce a magnitude decrement, a magnitude increment not being possible. For thermometer code 0000011, selecting bit 2 of MUX 408 will produce a magnitude increment, while selecting bit 4 of MUX 408 will produce a magnitude decrement. The same MUX selections are used for a thermometer code 1000011, selecting bit 2 of MUX 408 will produce a magnitude decrement while selecting bit 4 of MUX 408 will produce a magnitude increment. For a thermometer code of 0111111 or 1111111, selecting the LO input of MUX 612 produces a respective decrement and increment, an increment from 0111111 not being possible and a decrement from 1111111 not being possible. As with the circuit of FIG. 3, the only components are basic 2:1 Muxs and so each of a magnitude increment and decrement can be achieved with a single gate delay. The full listing of the output of the circuit of FIG. 3 is set out in table 3 below.

TABLE 3

| Thermometer Code | Select Increment (left) | Select Decrement (right) |
|---|---|---|
| 000000 | 000001 | 000000 |
| 000001 | 000011 | 000000 |
| 000011 | 000111 | 000001 |
| 000111 | 001111 | 000011 |
| 001111 | 011111 | 000111 |
| 011111 | 111111 | 001111 |
| 111111 | 111111 | 011111 |

Figure 4:
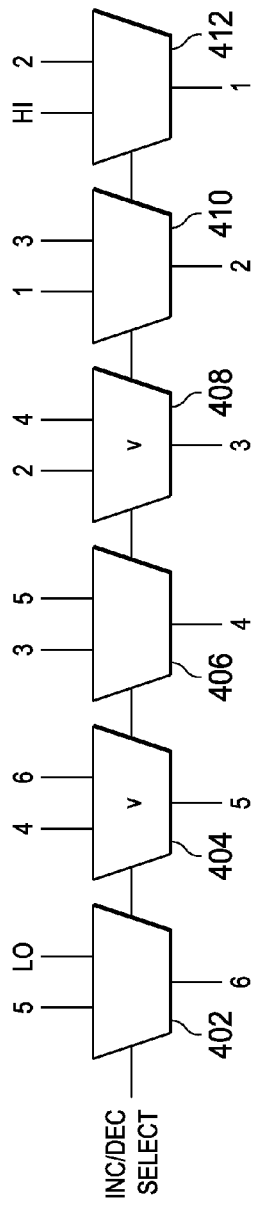
FIG. 4 is a block diagram of a circuit realisation of a magnitude increment and decrement operation in accordance with the present invention.
Figure 5:
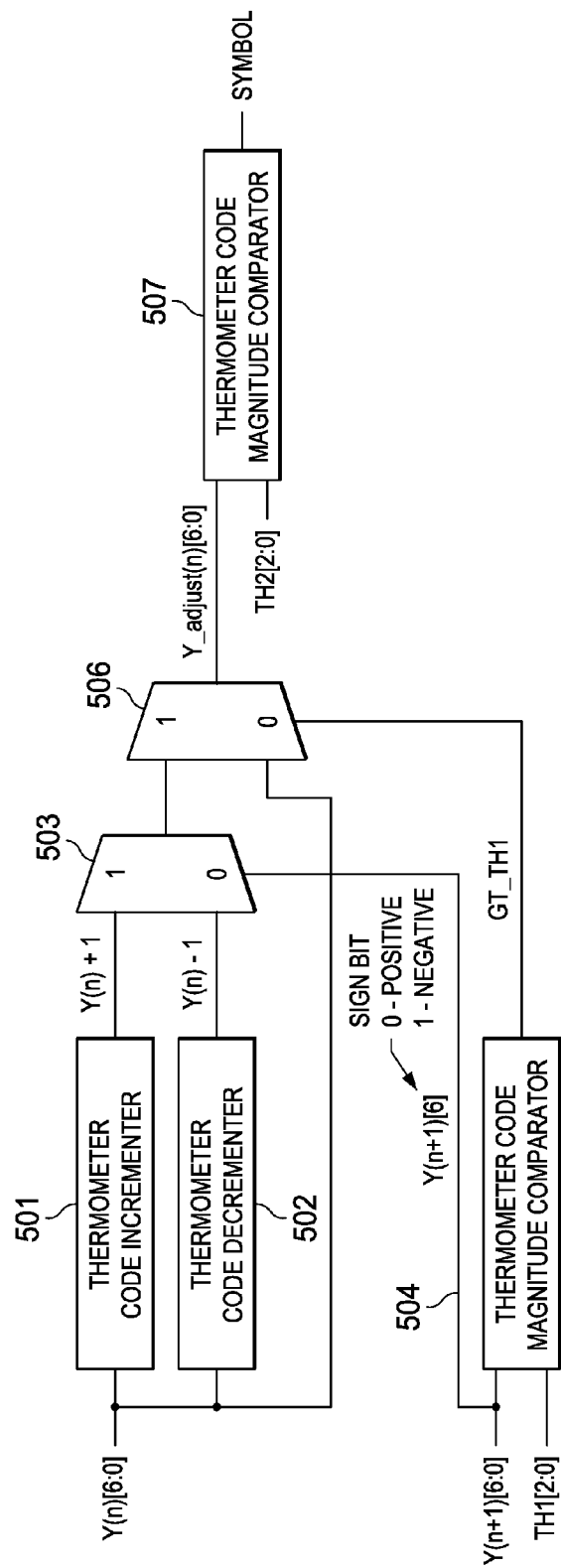
FIG. 5 is a diagram of a circuit realisation of the algorithm illustrated in the flow diagram of FIG. 1 and in accordance with the present invention.

FIG. 5 shows how the thermometer code magnitude compare arrangement of FIG. 3 and the thermometer code increment/decrement arrangement of FIG. 4 may be deployed to implement the algorithm of FIG. 1.

A thermometer code incrementer 501 (as described with reference to FIG. 4) increments the present sample value and a thermometer code decrementer 502 (also as described with reference to FIG. 4) decrements the present sample value which is selected as a modified value for onward transmission by multiplexer (MUX 503 depends upon the sign bit 504 of the sample. As mentioned above, since the increment/decrement circuitry for the thermometer code is the same, in some embodiments a single instance may be with increment or decrement directly selected. Next, a thermometer code magnitude compare block (505) (as described with reference to FIG. 3) compares a next sample value with the first threshold and the output selects either the modified or unmodified value of the current sample dependent upon the outcome via MUX 506. Finally a second thermometer code magnitude compare block (507) (also as described with reference to FIG. 3) compares the selected adjusted current sample value with the second threshold to provide the symbol output.

Figure 6:
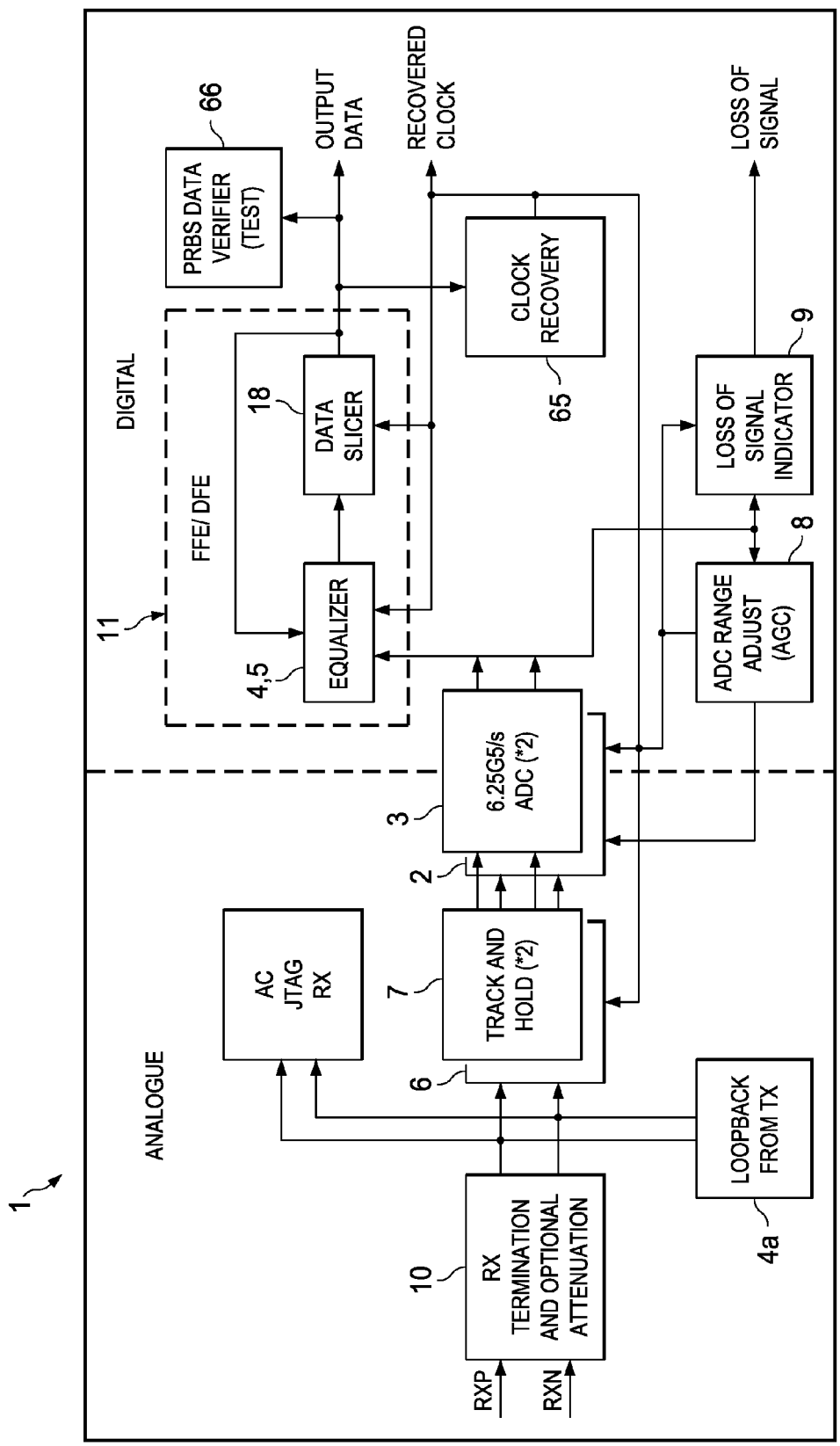
FIG. 6 is a block diagram of a receiver circuit, in which the invention may be used.

The present invention is useful in a SerDes circuit and indeed was developed for that application. Nonetheless, it should be understood that the invention may be used in other applications. A block diagram of a SerDes receiver circuit 1, which forms part of an integrated circuit, in which the present invention may be used is shown in FIG. 6. The invention may nonetheless be used in other applications.

In the receiver circuit 1 of FIG. 6 the input data is sampled at the baud-rate, digitized and the equalization and clock & data recovery (CDR) performed using numerical digital processing techniques. This approach results in the superior power/area scaling with process of digital circuitry compared to that of analogue, simplifies production testing, allows straightforward integration of a feed-forward equalizer and provides a flexible design with a configurable number of filter taps in the decision feedback equaliser. The circuit has been implemented in 65 nm CMOS, operating at a rate of 12.5 Gb/s.

The receiver circuit 1 comprises two baud-rate sampling ADCs (analogue to digital converters) 2 and 3, a digital 2-tap FFE (feed forward equaliser) 4 and digital 5-tap DFE (decision feedback equaliser) 5 to correct channel impairments.

The SerDes section of the integrated circuit, which includes the receiver circuit 1 is also provided with a transmitter, connected to transmit data over a parallel channel to that which the receiver circuit 1 is connected to receive data. The transmitter may comprise a 4-tap FIR filter to pre-compensate for channel impairments. In many applications the integrated circuit transmitting data to the receiver circuit 1 uses pre-compensation but in other applications the receiver circuit 1 works without pre-compensation being used at the other end.

The receiver 1 of FIG. 6 is now described in more detail. The received data is digitized at the baud-rate, typically 1.0 to 12.5 Gb/s, using a pair of interleaved track and hold stages (T/H) 6 and 7 and a respective pair of 23 level (4.5 bit) full-flash ADCs 2 and 3 (i.e. they sample and convert alternate bits of the received analogue data waveform). The two track & hold circuits enable interleaving of the half-rate ADCs and reduce signal related aperture timing errors. The two ADCs, each running at 6.25 Gb/s for 12.5 Gb/s incoming data rate provide baud-rate quantization of the received data. The ADC's dynamic range is normalized to the full input amplitude using a 7-bit automatic gain control (AGC) circuit 8. A loss of signal indication is provided by loss of signal unit 9 that detects when the gain control signal provided by the AGC is out-of-range. An optional attenuator is included in the termination block 10, which receives the signals from the transmission channel, to enable reception of large signals whilst minimizing signal overload.

The digital samples output from the ADCs 2 and 3 are interleaved and the resulting stream of samples is fed into a custom digital signal processing (DSP) data-path that performs the numerical feed-forward equalization and decision-feedback equalization.

An advantage of applying the equalization digitally is that it is straightforward to include feed-forward equalization as a delay-and-add function without any noise-sensitive analogue delay elements. The FFE tap weight is selected before use to compensate for pre-cursor ISI and can be bypassed to reduce latency. Whilst many standards require pre-cursor de-emphasis at the transmitter, inclusion at the receiver allows improved bit error rate (BER) performance with existing legacy transmitters.

Figure 7:
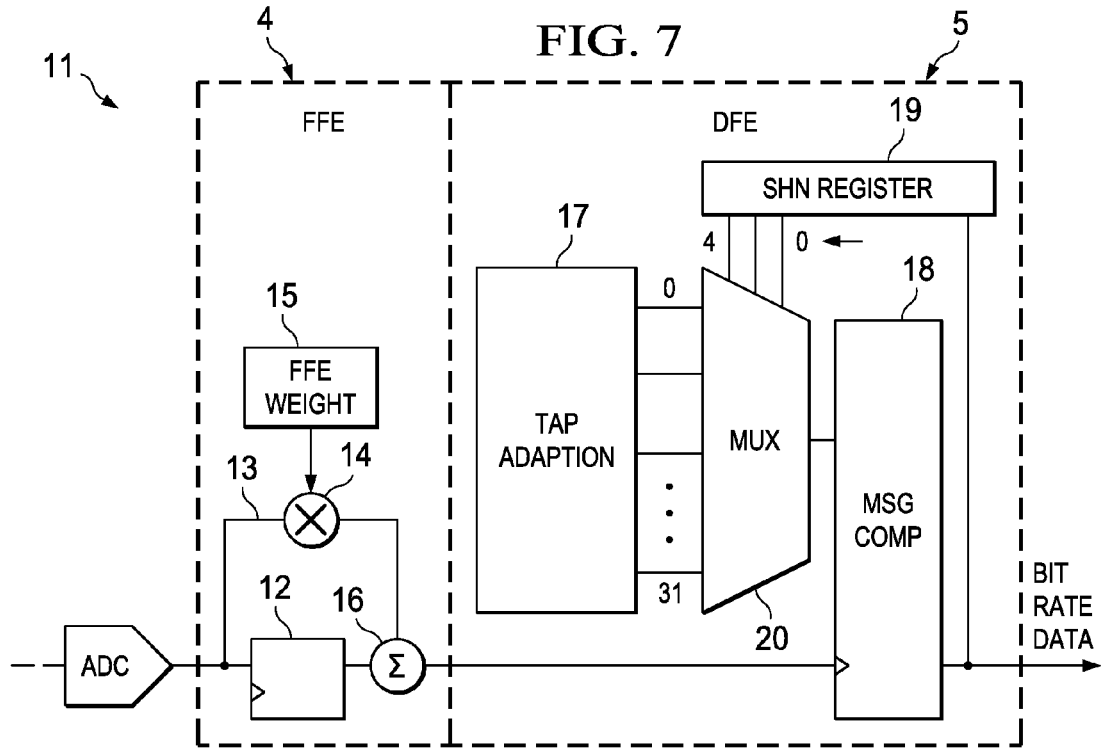
FIG. 7 shows an exemplary FFE/DFE.

The exemplary prior art FFE is shown in FIG. 7. The FFE serves to make an estimate of the future data bit value based up a selected slicing level, such as by assessing the sign of the raw adc sample; a positive sample is assumed to be a 1 and a negative sample a 0.

The DFE 5 uses an unrolled non-linear cancellation method ["Techniques for High-Speed implementation of Non-linear cancellation" S. Kasturia IEEE Journal on selected areas in Communications. June 1991]. The data output (i.e. the 1s and 0s originally transmitted) is the result of a magnitude comparison between the output of the FFE and a slicer-level dynamically selected from a set stored in a set of pre-programmed registers. The values are determined by a control circuit (not shown in FIG. 1) from the waveforms of test patterns sent during a setup phase of operation. The magnitude comparison is performed by a magnitude comparator 18 connected to receive the output of the FFE 4 and the selected slicer-level; it outputs a 1 if the former is higher than the latter and a 0 if it is lower or equal, thereby forming the output of the DFE 5.

The slicer-level is selected from one of 2n possible options depending on the previous n bits of data history. The history of the bits produced by the magnitude comparator 18 is recorded by a shift register 19 which is connected to shift them in. The parallel output of the shift register is connected to the select input of a multiplexer 20 whose data inputs are connected to the outputs of respective ones of the set 17 of registers holding the possible slicer-levels.

Unrolled tap adaption is performed using a least mean square (LMS) method where the optimum slicing level is defined to be the average of the two possible symbol amplitudes (+1−1) when proceeded by identical history bits. (For symmetry the symbols on the channel for the bit values 1 and 0 are given the values +1 and −1).

Although 5-taps of DFE were chosen for this implementation, this parameter is easily scaleable and performance can be traded-off against power consumption and die area. In addition, the digital equalizer is testable using standard ATPG (automatic test pattern generation) and circular built-in-self-test approaches.

What is claimed is:

1. A method of processing data comprising receiving a series of data samples (Y(1) Y(2) . . . Y(n), Y(n+1)), each sample being represented as an N-bit thermometer code, wherein the most significant bit thereof represents the sign of the data sample value Y(n) and the remaining N−1 bits represent the magnitude of the data sample; and executing a predetermined sequence of arithmetic operations directly on the series of N-bit thermometer code data samples to determine one of two values for each data sample, without any recoding of the thermometer code data samples;

wherein the step of executing a predetermined sequence of arithmetic operations comprises:

for each data sample Y(n), comparing the magnitude of the next consecutive data sample Y(n+1) in the series of data samples to a first threshold (th1);

if the magnitude of Y(n+1) is less than the first threshold (th1), setting an adjusted value (Y adjust (n)) of data sample Y(n) to the value of data sample Y(n);

if the magnitude of data sample Y (n+1) is not less than the threshold (th1), determining the sign of the data sample Y(n+1) from the MSB of Y(n+1);

incrementing or decrementing the value of Y(n) in dependence on the sign of the data sample Y(n+1).

comparing the magnitude of the adjusted value of Y(n) (Y adjust (n)) to a second threshold value (th2);

determining one of two values for data sample Y(n) on the basis of the comparison with the second threshold value (th2.

2. The method of claim 1 wherein a threshold is specified as a binary code.

3. The method of claim 2 wherein a comparing step comprises:

providing a plurality of two input multiplexers arranged in cascaded stages, there being one stage for each bit of said binary code and each multiplexer in a stage receiving a respective bit at its select input in order of bit significance;

each multiplexer of a first stage receiving a pair of thermometer code bits of consecutive significance, excepting the multiplexer which receives the bit of least significance which also receives a permanently high bit value and likewise excepting the multiplexer which receives the bit of greatest significance which also receives a permanently low bit value, each multiplexer of said stage providing its selected output; and each multiplexer of a next stage receiving a pair of outputs from a previous stage; wherein the outputs of said first stage of multiplexers are selected by the binary code bit of least significance and wherein the outputs of said next stage of multiplexers are selected by the binary code bit of next significance, the output of a final stage of said multiplexers being by the binary code bit of greatest significance to produce an output representative of said comparison.

4. The method of claim 1, wherein the step of incrementing or decrementing the value of Y(n) in dependence on the sign of the data sample Y(n+1) comprises;

decrementing the value of Y(n) to provide an adjusted value (Y_adjust (n)) of data sample Y(n) if the MSB of Y(n+1) has a positive value; or incrementing the value of Y(n) to provide an adjusted value (Y_adjust (n)) of data sample Y(n), if the MSB of Y(n+1) has a negative value.

5. The method of claim 1 wherein a step of incrementing or decrementing comprises:

providing a plurality of multiplexers receiving bits of said thermometer code, each multiplexer receiving a first bit of a certain significance at a first input;

a second bit of two greater significance than said certain significance at a second input; and providing a select input to each multiplexer to provide an increment if said first input of each multiplexer is selected by said select input and a decrement if said second input of each multiplexer is selected by said select input.

6. A method as claimed in claim 5 and wherein a multiplexer receives a permanently high value at its first input and a thermometer code bit of next to least significance at its second input.

7. A method as claimed in claim 5 and wherein a multiplexer receives a permanently low value at its second input and a thermometer code bit of next to greatest significance at its second input.

8. The method of claim 1, wherein the step of determining one of two values for data sample Y(n) on the basis of the comparison with the second threshold value (th2) comprises determining that data sample Y(n) has a value of +1, if the magnitude of the adjusted value of Y(n) (Y_adjust (n)) is greater than the second threshold (th2); or determining that data sample Y(n) has a value of −1, if the magnitude of the adjusted value of Y(n) (Y_adjust (n)) is not greater than the second threshold (th2).

9. The method of claim 1, wherein the N-bit thermometer code is a 7-bit code.

10. A magnitude comparator for comparing a value represented by a thermometer code with a value represented by a binary code including a plurality of two input multiplexers arranged in cascaded stages, there being one stage for each bit of said binary code and each multiplexer in a stage receiving a respective bit at its select input in order of bit significance;

each multiplexer of a first stage receiving a pair of thermometer code bits of consecutive significance, excepting the multiplexer which receives the bit of least significance which also receives a permanently high bit value and likewise excepting the multiplexer which receives the bit of greatest significance which also receives a permanently low bit value, each multiplexer of said stage providing its selected output; and each multiplexer of a next stage receiving a pair of outputs from a previous stage; wherein the outputs of said first stage of multiplexers are selected by the binary code bit of least significance and wherein the outputs of said next stage of multiplexers are selected by the binary code bit of next significance, the output of a final stage of said multiplexers being by the binary code bit of greatest significance to produce an output representative of said comparison.

11. A method for comparing a value represented by a thermometer code with a value represented by a binary code including the steps of providing a plurality of two input multiplexers arranged in cascaded stages, there being one stage for each bit of said binary code and each multiplexer in a stage receiving a respective bit at its select input in order of bit significance;

each multiplexer of a first stage receiving a pair of thermometer code bits of consecutive significance, excepting the multiplexer which receives the bit of least significance which also receives a permanently high bit value and likewise excepting the multiplexer which receives the bit of greatest significance which also receives a permanently low bit value, each multiplexer of said stage providing its selected output; and each multiplexer of a next stage receiving a pair of outputs from a previous stage; wherein the outputs of said first stage of multiplexers are selected by the binary code bit of least significance and wherein the outputs of said next stage of multiplexers are selected by the binary code bit of next significance, the output of a final stage of said multiplexers being by the binary code bit of greatest significance to produce an output representative of said comparison.

12. An incrementer/decrementer for a thermometer code including a plurality of multiplexers receiving bits of said thermometer code, each multiplexer of said incrementer/decrementer receiving a first bit of a certain significance at a first input;

a second bit of two greater significance than said certain significance at a second input; and a select input, the incrementer/decrementer providing an increment if said first input of each multiplexer is selected by said select input and a decrement if said second input of each multiplexer is selected by said select input; and wherein a multiplexer receives a permanently high value at its first input and a thermometer code bit of next to least significance at its second input.

13. An incrementer/decrementer for a thermometer code including a plurality of multiplexers receiving bits of said thermometer code, each multiplexer of said incrementer/decrementer receiving a first bit of a certain significance at a first input;

a second bit of two greater significance than said certain significance at a second input; and a select input, the incrementer/decrementer providing an increment if said first input of each multiplexer is selected by said select input and a decrement if said second input of each multiplexer is selected by said select input; and wherein a multiplexer receives a permanently low value at its second input and a thermometer code bit of next to greatest significance at its second input.

14. A method of incrementing/decrementing a thermometer code including providing a plurality of multiplexers receiving bits of said thermometer code, each multiplexer receiving
   a first bit of a certain significance at a first input;
   a second bit of two greater significance than said certain significance at a second input; and
providing a select input to each multiplexer to provide an increment if said first input of each multiplexer is selected by said select input and a decrement if said second input of each multiplexer is selected by said select input; and
   wherein a multiplexer receives a permanently high value at its first input and a thermometer code bit of next to least significance at its second input.

15. A method of incrementing/decrementing a thermometer code including providing a plurality of multiplexers receiving bits of said thermometer code, each multiplexer receiving
   a first bit of a certain significance at a first input;
   a second bit of two greater significance than said certain significance at a second input; and
providing a select input to each multiplexer to provide an increment if said first input of each multiplexer is selected by said select input and a decrement if said second input of each multiplexer is selected by said select input; and wherein a multiplexer receives a permanently low value at its second input and a thermometer code bit of next to greatest significance at its second input.

\* \* \* \* \*